United States Patent

Hayasi

[11] Patent Number: 5,373,418
[45] Date of Patent: Dec. 13, 1994

[54] ELECTRICAL DEVICE FOR MOUNTING ELECTRICAL COMPONENTS WITH ENHANCED THERMAL RADIATING PROPERTIES

[75] Inventor: Satoru Hayasi, Nagoya, Japan
[73] Assignee: Mitsubishi Denki Kabushiki Kaisha, Tokyo, Japan
[21] Appl. No.: 675,202
[22] Filed: Mar. 26, 1991

[30] Foreign Application Priority Data

Mar. 28, 1990 [JP] Japan .................. 2-79503

[51] Int. Cl.⁵ .................................. H05K 7/20
[52] U.S. Cl. ..................... 361/707; 257/718; 361/690; 361/809
[58] Field of Search ............ 357/81; 174/16.3; 361/383–389, 401, 417, 419, 420

[56] References Cited

U.S. PATENT DOCUMENTS

| | | | |
|---|---|---|---|
| 3,018,424 | 1/1962 | Colaiaco | 361/387 |
| 4,872,102 | 10/1989 | Getter | 363/141 |
| 4,918,571 | 4/1990 | Grabbe | 361/388 |

FOREIGN PATENT DOCUMENTS

| | | |
|---|---|---|
| 2919058 | 11/1980 | Germany . |
| 3307654 | 9/1984 | Germany . |
| 4009445 | 10/1990 | Germany . |
| 59-146981 | 10/1984 | Japan . |
| 60-151186 | 10/1985 | Japan . |
| 62-30353 | 2/1987 | Japan . |
| 1441692 | 7/1976 | United Kingdom ........... 361/392 |

OTHER PUBLICATIONS

Cunavelis et al., External Module Heat Sink Fastened to Board, *IBM Technical Disclosure Bulletin*, vol. 14, No. 1, Jun. 1971, p. 182.

*Primary Examiner*—Gregory D. Thompson
*Attorney, Agent, or Firm*—Rothwell, Figg, Ernst & Kurz

[57] ABSTRACT

An electrical device for mounting electrical components includes an integrally die-cast aluminum base 20 having at an upper side thereof recesses 20a for receiving the electrical components and at the bottom side thereof radiator fins 20b for radiating heat generated by the electrical components. The terminals 31 of the electrical components accommodated in the recesses of the metal base 20 are substantially at the same height and electrical interconnection among them is secured via the conductors 21a carried on a printed circuit board 21. A high heat conductivity resin material 29 is interposed between the recesses and components 22, 23, and 27 that generate a large amount of heat. On the other hand, a heat insulating resin material 30 is interposed between the recess and the component 26 that generates a small or negligible amount of heat.

13 Claims, 4 Drawing Sheets

ELECTRICAL DEVICE FOR MOUNTING ELECTRICAL COMPONENTS WITH ENHANCED THERMAL RADIATING PROPERTIES

BACKGROUND OF THE INVENTION

This invention relates to electrical devices for mounting electrical components and methods of producing the same, and more particularly to such devices and methods by which a variety of electrical components can be assembled compactly with enhanced assembling efficiency.

FIG. 2 is a circuit diagram of an electrical device disclosed, for example, in Japanese laid-open utility model application No. 60-151186. FIG. 3 is a top view of the electrical device for mounting electrical components of the circuit of FIG. 2, and FIGS. 4 and 5 show the sections along the lines A—A and B—B of FIG. 3, respectively. As shown in FIG. 2, the circuit is an inverter circuit for converting the frequency, etc., of a three-phase power, and thus includes: an electromagnetic contactor 1 for turning on and off the power; reactors 2; control transformer 3 for converting the input voltage to a predetermined voltage level; diode bridge rectifier circuit 4 for rectifying the AC current; smoothing capacitor 5 for smoothing the DC current rectified via the diode bridge rectifier circuit 4; discharge transistor 6 for discharging the current charging the capacitors such as smoothing capacitor 5; and transistor inverter circuit 7 for converting the DC current, smoothed via the smoothing capacitor 5, into an AC current of desired frequency.

Finned aluminum base 8 radiates the heat generated by the transistor invertor circuit 7. Mold resin box 9 accommodates the electromagnetic contactor 1, the reactors 2, the control transformer 3, and the smoothing capacitor 5. An electrically insulating substrate 10 is provided with short bars for making large-current-carrying electrical connections among the terminals 14 of the electromagnetic contactor 1, the smoothing capacitor 5, the transistor invertor circuit 7, etc. A printed circuit board 11 includes electronic elements for generating control signals. The mold resin box 9 is provided with a cover 12 (removed in FIGS. 3 and 5).

The electrical components are fixed via screws on finned aluminum base 8 or within mold resin box 9, in such a manner that the terminals 14 of the electrical components are leveled in their height. The electrically insulating substrate 10 is disposed above the electrical components, such that the short bars on the electrically insulating substrate 10 are in contact with the terminals 14 of the electrical components. The printed circuit board 11 is positioned above the electrically insulating substrate 10 with a predetermined gap formed therebetween. Screws 13 extending through the printed circuit board 11 and the short bars and the electrically insulating substrate 10 secure the electrically insulating substrate 10 and the printed circuit board 11 such that secure electrical connections among the electrical components are ensured. It is noted that the finned aluminum base 8 carries the electrical components which generate a large amount of heat.

The above electrical device for mounting electrical components has the following disadvantages. First, since the electrical components are fixed via screws on the mold resin box 9 and the finned aluminum base 8, precise positioning of the electrical components is difficult to accomplish. Second, if the terminals 14 are not at the same level, the short bars are deformed or their electrical contacts with the terminals 14 of the electrical components may fail. In order to make equal the heights of the terminals 14, it is necessary to extend the length of some of the terminals or to interpose spacers between some of the electrical components and the bases. This precise leveling of the terminals is difficult to accomplish. Finally and thirdly, since a separate finned aluminum base 8 is necessary for radiating the heat of heat generating electrical components, the device is in need of two bases, the finned aluminum base 8 and the mold resin box 9. Thus, it is difficult to reduce the overall size of the electrical device for mounting electrical components.

SUMMARY OF THE INVENTION

It is therefore an object of this invention to provide a electrical device for mounting electrical components and method of producing the same, whereby a variety of electrical components can be assembled compactly with enhanced assembling efficiency and precision.

The above object is accomplished in accordance with the principle of this invention by a electrical device for mounting electrical components, which includes: a metal base having a plurality of recesses formed on one side thereof for receiving electrical components having terminals projecting therefrom, wherein said recesses have dimensions corresponding to exterior dimensions of the electrical components accommodated therein, such that said terminals of the respective electrical components accommodated in the recesses project to a predetermined height above the metal base; and a circuit board carrying a predetermined pattern of electrical conductors thereon, said circuit board being positioned above said one side of the metal base such that said terminals of the electrical components are in electrical contact with said pattern of electrical conductors carried on said circuit board. Preferably, the terminals of the electrical components accommodated in the recesses of the metal base extend substantially to an equal height above said metal base. Further, it is preferred that the metal base has fins formed integrally on a side thereof opposite to the side on which said recesses are formed, said fins radiating heat generated via electrical components accommodated in the recesses of the metal base.

Furthermore, it is preferred that the electrical components generating a large amount of heat are accommodated in the recesses of the metal base via a high heat conductivity resin and the electrical components generating a small or negligible amount of heat are accommodated in the recesses of the metal base via a heat insulating resin.

The above object is also accomplished by a method of producing the above electrical device for mounting electrical components, which includes the steps of:

forming a metal base having on one side thereof the recesses for receiving the electrical components, said recesses having dimensions corresponding to exterior dimensions of the respective electrical components received therein;

fixing board-mounted electrical components on a circuit board carrying a pattern of electrical conductors thereon;

pouring predetermined amounts of a high heat conductivity resin and a heat insulating resin into respective recesses of the metal base;

inserting, before the resins are set, electrical components other than said board-mounted electrical components into respective recesses of the metal base; and positioning, before the resins are set, said circuit board above said side of the metal base having the recesses formed thereon and inserting the board-mounted electrical components carried on said circuit board into respective recesses of the metal base, terminals of electrical components accommodated in the recesses of the metal base coming into electrical contact with electrical conductors on the circuit board.

BRIEF DESCRIPTION OF THE DRAWINGS

In the drawings, like reference numeral represent like or corresponding parts.

DETAILED DESCRIPTION OF THE PREFERRED EMBODIMENT

Figure 1:
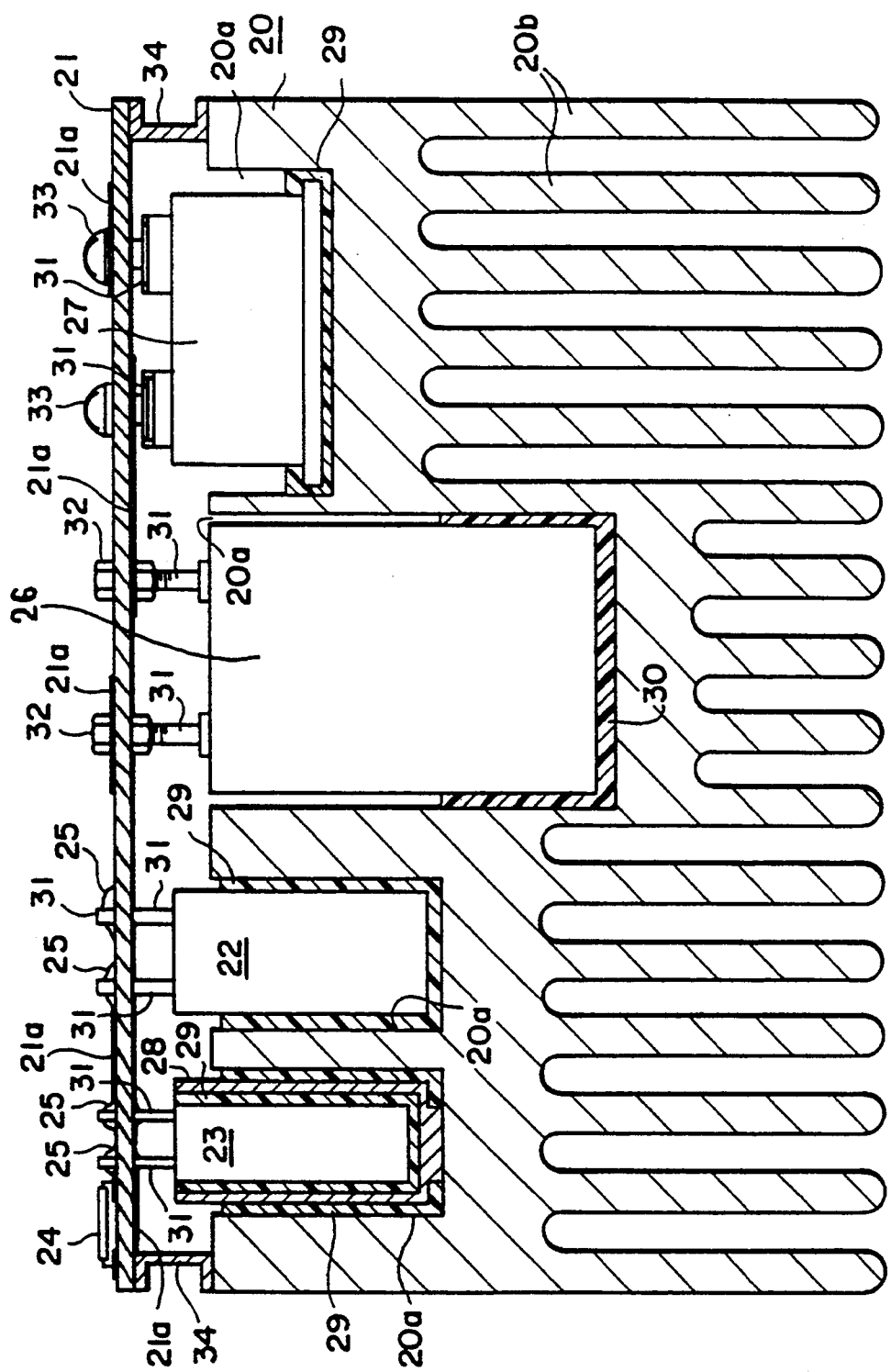
FIG. 1 is a sectional side view of a electrical device for mounting electrical components including a thick substantially plate-shaped metal base according to this invention.
Figure 2:
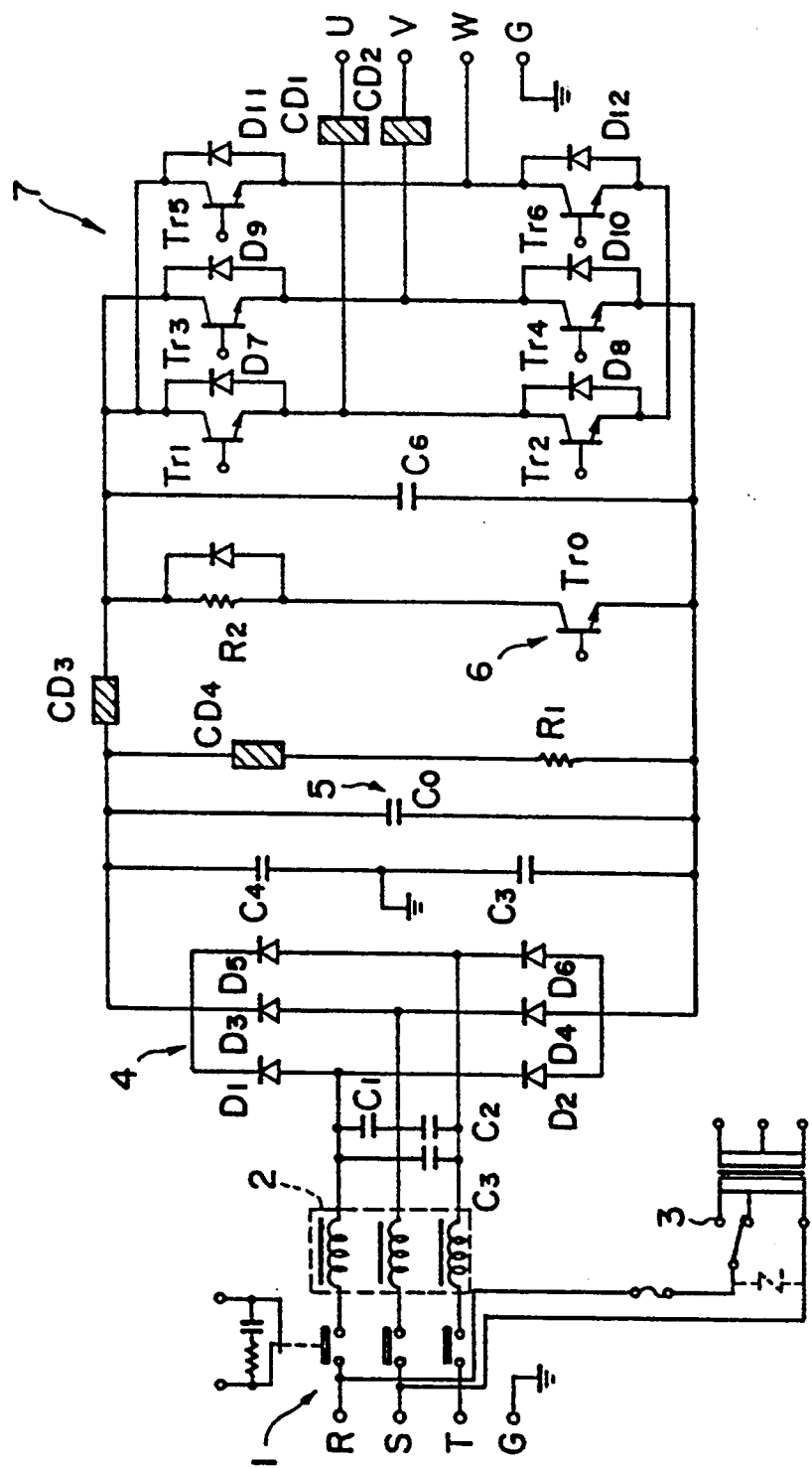
FIG. 2 is a circuit diagram showing the circuit of a typical converter the electrical components of which are mounted on an electrical device for mounting electrical components.
Figure 3:
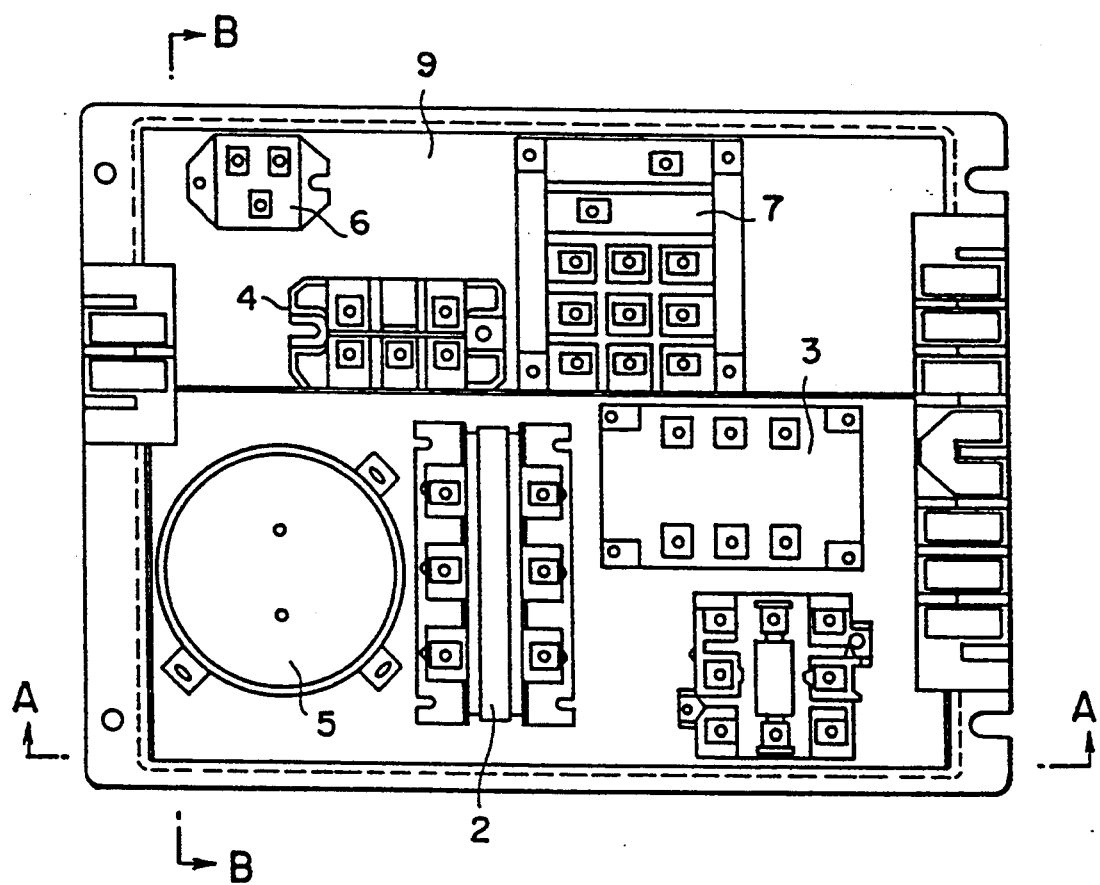
FIG. 3 is a top view of a conventional electrical device for mounting electrical components for mounting the electrical components of the circuit of FIG. 2.
Figure 4:
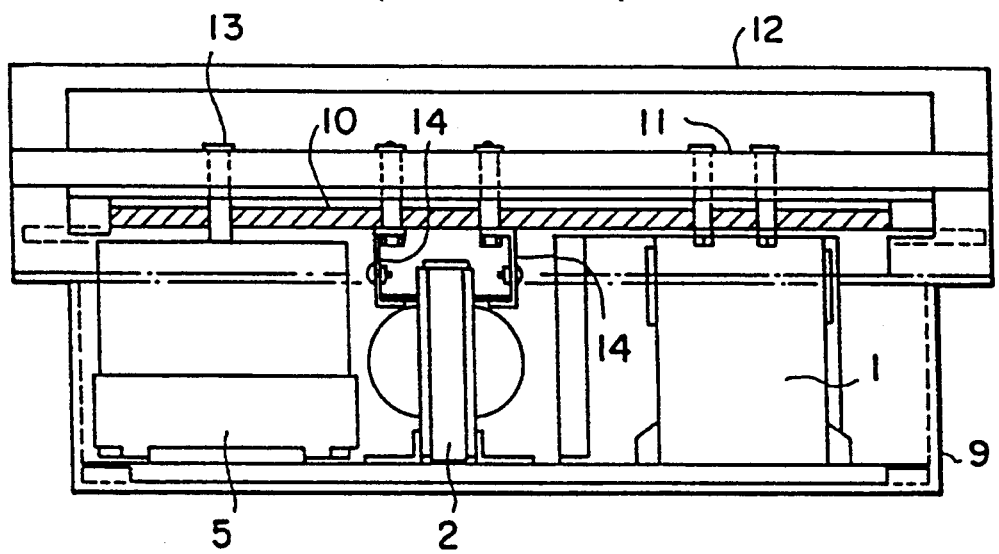
FIGS. 4 and 5 show sections along the lines A—A and B—B of FIG. 3.
Figure 5:
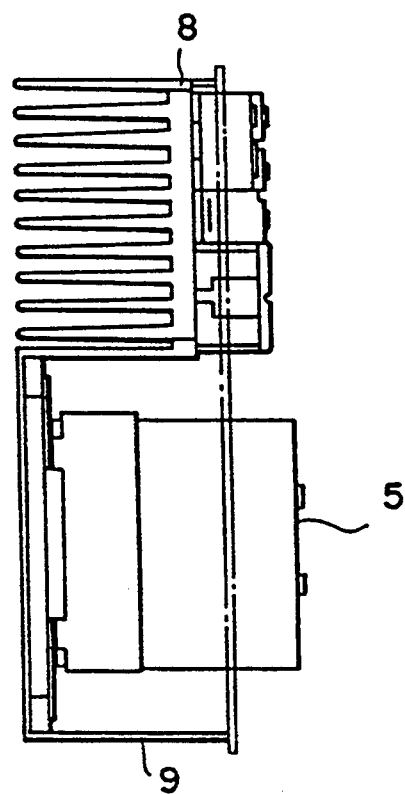

Referring now to FIG. 1 of the drawings, an embodiment of this invention is described.

An aluminum metal base 20, made via aluminum die casting process, is provided, at the upper side thereof, with a plurality of recesses 20a for receiving and fittingly accommodating the electrical components, and, at the bottom side thereof, with radiating fins 20b for radiating the heat generated by the electrical components. The recesses 20a, formed at predetermined positions on the metal base 20, have dimensions corresponding to the respective heights and the shapes of the electrical components accommodated therein, such that the terminals of the electrical components are leveled, i.e., extend above the upper surface of the metal base 20 to substantially the same height. The recesses 20a and the radiating fins 20b are formed simultaneously when the metal base 20 is cast by aluminum die casting process.

A printed circuit board 21 having a predetermined pattern of electrical conductors 21a is disposed above the metal base 20 to make electrical connections among the electrical components accommodated in the respective recesses 20a of the metal base 20 (such as a resistor 22, a cement resistor 23, a electrolytic capacitor 26, and a power module 27 such as a power transistor module) and the electrical components disposed on the printed circuit board 21 (such as a capacitor 24). The cement resistor 23 generating a particularly large amount of heat is enclosed in a copper covering 28. The copper covering 28 has the same form as the exterior of the cement resistor 23 and is disposed in the recess 20a such that the bottom thereof is in direct contact with the metal base 20. The cover 28 may be made of a good heat conductive material other than copper, such as aluminum, iron, or zinc alloys. A high heat conductivity resin 29 is filled into the recesses 20a accommodating the resistor 22, cement resistor 23, and the power module 27, which generate a large amount of heat. It is noted that the high heat conductivity resin 29 fills the gap between the cement resistor 23, the copper covering 28, and the recess 20a. A resin having fluidity at the normal or elevated temperature, such as an epoxy resin, a silicone resin, a urethane resin or a polyester resin, or a mixture thereof, may be utilized as the high heat conductivity resin 29, which preferably includes, as a good heat conducting filler material, a powder made of one or a plurality of the materials selected from: copper, aluminum, silver, gold, iron, stainless steel, brass, alumina, magnesia, crystalline silica, aluminum nitride, silicon oxide, beryllia, silicon, boron nitride, zirconium silicate, silicon carbide, and diamond.

In the case of this embodiment, the high heat conductivity resin 29 is made as follows. An amine type setting agent is added to an epoxy resin. Further, to 100 parts by weight of the epoxy resin are mixed as a filler material 900 parts by weight of alumina powder, thereby obtaining a resin having a heat conductivity at about $51 \times 10^{-4}$ cal/cm.sec.°C.

A heat insulating resin 30 is filled in the recess 20a accommodating the electrolytic capacitor 26 generating a small amount of heat. A resin having fluidity at the normal or elevated temperature, such as an epoxy resin, a silicone resin, a urethane resin, or a polyester resin, or a mixture thereof, may be utilized as the heat insulating resin 30, which preferably includes a filler made of minute hollow spheres (referred to as balloon filler) that are made of one or a plurality of the materials selected from: phenol resin (phenol aldehyde resin), epoxy resin, silicone resin, urea resin (urea-formaldehyde resin), alumina, quartz sand, silica, zirconia, and glass.

In the case of this embodiment, the heat insulating resin 30 is made as follows. An amine type setting agent is added to an epoxy resin. Further, to 100 parts by weight of the epoxy resin are mixed as balloon filler 50 parts by weight of minute hollow silica spheres, thereby obtaining a resin having a heat conductivity at about $2 \times 10^{-4}$ cal/cm. sec.°C.

The electrical components accommodated in the recesses 20a of the metal base 20 are electrically connected to the printed circuit board 21 via terminals 31 thereof. The terminals 31 of the resistor 22 and cement resistor 23 are electrically connected to the electrical conductors 21a of the printed circuit board 21 via the solder 25. The terminals 31 of the electrolytic capacitor 26 are electrically connected to the electrical conductors 21a of the printed circuit board 21 via nuts 32. The terminals 31 of the power module 27 are electrically connected to the electrical conductors 21a of the printed circuit board 21 via fixing screws 33. The printed circuit board 21 is supported on the metal base 20 via side supports 34 secured on the metal base 20.

The electrical device for mounting electrical components of this embodiment is assembled as follows. First, the board-mounted electrical components, the capacitor 24, the resistor 22, and the cement resistor 23, are soldered to and fixed on the printed circuit board 21 via the solder 25. Thereafter, a predetermined amount of the high heat conductivity resin 29 is poured into the copper covering 28 for the cement resistor 23, and then the cement resistor 23 is encapsulated via the copper covering 28. Further, predetermined amounts of the high heat conductivity resin 29 are poured into the recesses 20a for accommodating the power module 27, the resistor 22, and the cement resistor 23, while a predetermined amount of the heat insulating resin 30 is poured into the recess 20a for accommodating the electrolytic capacitor 26. Thereafter, the power module 27 and the electrolytic capacitor 26 are fitted into the respective recesses 20a of the metal base 20, and the printed circuit board 21 having mounted thereon the resistor 22 and the cement resistor 23, etc., is fixed via screws (not shown) on the side supports 34 secured on the metal base 20. Furthermore, before the high heat conductivity resin 29 and the heat insulating resin 30 are set, the fixing screws 33 and the nuts 32 are fastened on the terminals 31 of the power module 27 and the electrolytic capacitor 26, respectively. The high heat conductivity resin 29 and the heat insulating resin 30 are set by leaving them at the normal temperature or by heating them. The assembling of the electrical device for mounting electrical components is thus completed.

The electrical device for mounting electrical components according to this embodiment has the following advantages. Since the recesses 20a are formed on the metal base 20 in accordance with the height and the exterior forms of the power module 27 and the electrolytic capacitor 26, the horizontal and the vertical positioning of these electrical components on the metal base 20 can be accomplished accurately simply by fitting them into the respective recesses 20a. Further, there may be variations in the dimensions of the electrical components or of the gap between the metal base 20 and the printed circuit board 21, such that the bottom ends of the electrical components, such as the resistor 22 and the cement resistor 23, screwed or soldered to the printed circuit board 21, are not necessarily in contact with the metal base 20. However, since the resins are interposed between the recesses 20a of the metal base 20 and the electrical components such as resistor 22 and the cement resistor 23, the variations of dimensions are thereby absorbed and buffered, and the electrical components are securely fixed to the metal base 20 when the resins are set. Furthermore, since the high heat conductivity resin 29 is filled in the recesses 20a for the heat generating electrical components such as the power module 27 and the heat insulating resin 30 is filled in the recesses 20a for the non-heat generating electrical components such as electrolytic capacitor 26, the heat generating electrical components are cooled efficiently while the intrusion of heat into the non-heat generating electrical components is effectively prevented. In addition, the electrical components generating a particularly large amount of heat, such as the cement resistor 23, are encapsulated in the copper covering 28. Thus, the heat generated in such electrical components are quickly transmitted to the copper covering 28, and from the copper covering 28 to the metal base 20, to be effectively radiated from the radiating fins 20b of the metal base 20.

It is noted that the metal base 20 may be made of any one of good heat conductor metals other than the diecast aluminum, such as copper, zinc alloys, or iron. Even then, substantially the same meritorious effect can be obtained.

What is claimed is:

1. A device for mounting electrical components, comprising:

a metal base having a plurality of recesses formed on one side thereof, each of which is configured to receive an electrical component having terminals projecting therefrom, such that each of said recesses has dimensions corresponding to exterior dimensions of such electrical component to be accommodated therein;

each of said recesses further having means for receiving an electrical component to be accommodated therein such that terminals of such an electrical component project to a predetermined height above said metal base, and wherein such electrical components are mounted to inner surfaces of said recesses; and a circuit board carrying a predetermined pattern of electrical conductors thereon, said circuit board being positioned above said one side of said metal base such that when each of said recesses receives an electrical component to be accommodated therein terminals of such electrical components are in electrical contact with said pattern of electrical conductors carried on said circuit board.

2. A device for mounting electrical components, as claimed in claim 1, wherein terminals of electrical components accommodated in said recesses of said metal base extend substantially to an equal height above said metal base.

3. A device for mounting electrical components, as claimed in claim 1, wherein said metal base has fins formed integrally on a side thereof opposite to said side on which said recesses are formed, said fins radiating heat generated via electrical components accommodated in said recesses of said metal base.

4. A device for mounting electrical components, as claimed in claim 3, wherein said terminals of the electrical components accommodated in said recesses of said metal base extend substantially to an equal height above said metal base.

5. A device for mounting electrical components, as claimed in claim 1, wherein certain electrical components of the totality of electrical components mounted in the device generating a large amount of heat are accommodated in said recesses of said metal base via a high heat conductivity resin.

6. A device for mounting electrical components, as claimed in claim 5, wherein certain electrical components of the totality of electrical components mounted in the device generating a small or negligible amount of heat are accommodated in said recesses of said metal base via a heat insulating resin.

7. A device for mounting electrical components, as claimed in claim 5, wherein an electrical component generating a particularly large amount of heat is encapsulated in a cover made of a good heat conductive material, and wherein gaps between such encapsulated electrical component and the cover and between the cover and the recess accommodating such encapsulated electrical component is filled with said high heat conductivity resin.

8. A device for mounting electrical components, as claimed in claim 3, wherein electrical components generating a large amount of heat are accommodated in said recesses of said metal base via a high heat conductivity resin.

9. A device for mounting electrical components, as claimed in claim 8, wherein electrical components generating a small or negligible amount of heat are accommodated in said recesses of said metal base via a heat insulating resin.

10. A device for mounting electrical components, as claimed in claim 8, wherein an electrical component generating a particularly large amount of heat is encapsulated in a cover made of a good heat conductive material, wherein gaps between such encapsulated electrical component and the cover and between the cover and the recess accommodating such encapsulated electrical component is filled with said high heat conductivity resin.

11. A method of producing an electrical device for mounting electrical components, comprising the steps of:

forming a metal base having on one side thereof recesses for receiving electrical components, said recesses having dimensions corresponding to exterior dimensions of respective electrical components received therein;

fixing electrical components to be board-mounted on a circuit board carrying a pattern of electrical conductors thereon;

pouring predetermined amounts of a high heat conductivity resin and a heat insulating resin into respective recesses of said metal base;

inserting, before said resins are set, electrical components other than said board-mounted electrical components into respective recesses of said metal base; and positioning, before said resins are set, said circuit board above said side of said metal base having the recesses formed thereon and inserting said board-mounted electrical components carried on said circuit board into respective recesses of said metal base, terminals of electrical components accommodated in said recesses of said metal base coming into electrical contact with electrical conductors on circuit board.

12. A method of producing an electrical device for mounting electrical components, comprising the steps of:

integrally forming a metal base having on one side thereof recesses for receiving electrical components and on another side thereof fins for radiating heat, said recesses having dimensions corresponding to exterior dimensions of respective electrical components received therein;

fixing electrical components to be board-mounted on a circuit board carrying a pattern of electrical conductors thereon;

pouring predetermined amounts of a high heat conductivity resin and a heat insulating resin into respective recesses of said metal base;

inserting, before said resins are set, electrical components other than said board-mounted electrical components into respective recesses of said metal base; and positioning, before said resins are set, said circuit board above said side of said metal base having said recesses formed thereon and inserting said board-mounted electrical components carried on said circuit board into respective recesses of said metal base, terminals of electrical components accommodated in said recesses of said metal base coming into electrical contact with electrical conductors on said circuit board.

13. A method of producing of an electrical device for mounting electrical components as claimed in claim 12, wherein said forming step comprises an aluminum die casting process for forming an integral metal base made of aluminum.

* * * * *

UNITED STATES PATENT AND TRADEMARK OFFICE
CERTIFICATE OF CORRECTION

PATENT NO. : 5,373,418
DATED : December 13, 1994
INVENTOR(S) : Satoru Hayasi

It is certified that error appears in the above-indentified patent and that said Letters Patent is hereby corrected as shown below:

Col 7, line 34 (claim 11), after "on" insert --said--.

Signed and Sealed this

Second Day of May, 1995

Attest:

BRUCE LEHMAN

*Attesting Officer*  *Commissioner of Patents and Trademarks*